(12) United States Patent
Sasaki et al.

(10) Patent No.: US 9,607,813 B2
(45) Date of Patent: Mar. 28, 2017

(54) MAGNETIC FIELD GENERATION APPARATUS AND SPUTTERING APPARATUS

(71) Applicant: Sony Corporation, Tokyo (JP)

(72) Inventors: Jun Sasaki, Kanagawa (JP); Atsuhiro Abe, Kanagawa (JP); Ryoichi Hiratsuka, Miyagi (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/319,638

(22) Filed: Jun. 30, 2014

(65) Prior Publication Data
US 2015/0014158 A1 Jan. 15, 2015

(30) Foreign Application Priority Data

Jul. 11, 2013 (JP) ................................. 2013-145204

(51) Int. Cl.
*H01J 37/34* (2006.01)
*C23C 14/35* (2006.01)
*H01F 7/02* (2006.01)

(52) U.S. Cl.
CPC .......... *H01J 37/3452* (2013.01); *C23C 14/35* (2013.01); *H01F 7/0278* (2013.01); *H01J 37/3405* (2013.01); *H01J 37/345* (2013.01); *H01J 37/3455* (2013.01)

(58) Field of Classification Search
CPC .. H01J 37/345; H01J 37/3455; H01J 37/3452; H01J 37/3405; C23C 14/35
See application file for complete search history.

(56) References Cited

U.S. PATENT DOCUMENTS

| | | | | |
|---|---|---|---|---|
| 5,262,028 | A * | 11/1993 | Manley | 204/192.12 |
| 8,016,982 | B2 * | 9/2011 | Yamamoto et al. | 204/192.1 |
| 8,398,834 | B2 * | 3/2013 | Hollars | 204/298.22 |
| 8,617,363 | B2 * | 12/2013 | Mizuno et al. | 204/298.16 |
| 8,961,756 | B2 * | 2/2015 | Inagawa et al. | 204/298.19 |
| 9,017,534 | B2 * | 4/2015 | Yamamoto | C23C 14/325 204/298.11 |
| 2007/0175748 | A1* | 8/2007 | Atamny et al. | 204/192.1 |
| 2008/0296142 | A1* | 12/2008 | Le | C23C 14/3407 204/155 |
| 2009/0205949 | A1* | 8/2009 | Zueger | 204/192.12 |
| 2012/0097534 | A1* | 4/2012 | Takahashi et al. | 204/298.12 |

FOREIGN PATENT DOCUMENTS

JP 2006-016634 1/2006
JP 4845836 10/2011

* cited by examiner

*Primary Examiner* — Michael Band
(74) *Attorney, Agent, or Firm* — Dentons US LLP

(57) ABSTRACT

Provided is a magnetic field generation apparatus including: two or more main magnetic pole portions configured to generate a main magnetic field; one or more secondary magnetic pole portions including a plurality of first divisional magnets obtained by a division, that generate a secondary magnetic field for adjusting the generated main magnetic field; and a yoke portion including one or more first yokes opposing the plurality of first divisional magnets in correspondence with the one or more secondary magnetic pole portions.

15 Claims, 11 Drawing Sheets

MAGNETIC FIELD GENERATION APPARATUS AND SPUTTERING APPARATUS

CROSS REFERENCE TO RELATED APPLICATIONS

This application claims the benefit of Japanese Priority Patent Application JP 2013-145204 filed Jul. 11, 2013, the entire contents of which are incorporated herein by reference.

BACKGROUND

The present disclosure relates to a magnetic field generation apparatus and a sputtering apparatus that uses the magnetic field generation apparatus.

Japanese Patent No. 4845836 (hereinafter, referred to as Patent Document 1) discloses a magnetron sputtering apparatus for forming a thin film on a substrate surface formed of a wafer, glass, or the like. As shown in FIG. 1 etc. of Patent Document 1, a central magnet 2 is erected at a center portion of a bottom yoke 1, and a peripheral magnet 3 is erected so as to surround the periphery thereof. A first auxiliary magnet 4 and a second auxiliary magnet 5 are erected between the central magnet 2 and the peripheral magnet 3. By the magnet circuit having such a structure, a magnetic field having a distribution in which a vertical magnetic field component on a surface of a target 7 passes a zero level 3 times is formed. Accordingly, the target 7 can be sputtered uniformly (see paragraphs [0020] to [0025] etc. of Patent Document 1).

Further, Japanese Patent Application Laid-open No. 2006-16634 (hereinafter, referred to as Patent Document 2) also discloses a magnetic-field-generating device used in a magnetron sputtering apparatus. As shown in FIG. 1 etc. of Patent Document 2, a middle side permanent magnet 1 and an outside permanent magnet 2 that is provided so as to surround the middle side permanent magnet 1 are provided as a magnetic circuit for generating a magnetic field. Further, a shunt plate 6 formed of a magnetic material is provided between the middle side permanent magnet 1 and the outside permanent magnet 2 while being parallel with a target surface. The shunt plate 6 is arranged so that a vertical magnetic field component on a surface of a target 10 becomes flat at zero or near zero, or crosses a zero point three times. By such a magnetic field, an erosion area where the target 10 is eroded by the magnetic field is widened (see paragraphs [0021], [0028], [0032], etc. of Patent Document 2).

SUMMARY

As described above, in the magnetron sputtering apparatus disclosed in Patent Documents 1 and 2, a technique of flattening the magnetic field component on the target surface is used. In such a magnetron sputtering apparatus and the like, a technique that enables a magnetic field distribution to be adjusted with ease is being desired.

In view of the circumstances as described above, there is a need for a magnetic field generation apparatus capable of easily adjusting a magnetic field distribution and a sputtering apparatus that uses the magnetic field generation apparatus.

According to an embodiment of the present disclosure, there is provided a magnetic field generation apparatus including two or more main magnetic pole portions, one or more secondary magnetic pole portions, and a yoke portion.

The two or more main magnetic pole portions are configured to generate a main magnetic field.

The one or more secondary magnetic pole portions include a plurality of first divisional magnets obtained by a division, that generate a secondary magnetic field for adjusting the generated main magnetic field.

The yoke portion includes one or more first yokes opposing the plurality of first divisional magnets in correspondence with the one or more secondary magnetic pole portions.

In the magnetic field generation apparatus, the plurality of first divisional magnets are provided for generating the secondary magnetic field for adjusting the main magnetic field. For example, by adjusting the number, positions, and the like of the plurality of first divisional magnets, an intensity and distribution of the secondary magnetic field can be adjusted with ease. As a result, the distribution of the main magnetic field can also be adjusted with ease. Moreover, the first yokes are provided so as to oppose the plurality of first divisional magnets in correspondence with the secondary magnetic pole portions. Accordingly, it becomes possible to prevent the secondary magnetic field generated by the plurality of first divisional magnets from becoming uneven.

The two or more main magnetic pole portions may each include a plurality of second divisional magnets obtained by a division. In this case, the yoke portion may include two or more second yokes opposing the plurality of second divisional magnets in correspondence with the two or more main magnetic pole portions.

With this structure, by adjusting the number, positions, and the like of the plurality of second divisional magnets, for example, an intensity and distribution of the main magnetic field can be adjusted with ease. Since the second yokes are provided so as to oppose the plurality of second divisional magnets, it becomes possible to prevent the main magnetic field generated by the plurality of second divisional magnets from becoming uneven.

The magnetic field generation apparatus may further include a generation portion that is a generation position of the main magnetic field.

In this case, the two or more main magnetic pole portions may include a first main magnetic pole portion having an N pole on the generation portion side and a second main magnetic pole portion having an S pole on the generation portion side. Further, the one or more secondary magnetic pole portions may include a first secondary magnetic pole portion that is provided in the vicinity of the second main magnetic pole portion between the first main magnetic pole portion and the second main magnetic pole portion and has an N pole on the generation portion side and a second secondary magnetic pole portion that is provided in the vicinity of the first main magnetic pole portion between the first main magnetic pole portion and the second main magnetic pole portion and has an S pole on the generation portion side. Furthermore, the one or more first yokes may be provided between the plurality of first divisional magnets and the generation portion, and the two or more second yokes may be provided between the plurality of second divisional magnets and the generation portion.

By providing the main magnetic pole portions and the secondary magnetic pole portions as described above, the main magnetic field generated from the generation portion can be made parallel on an upper side of the generation portion.

The generation portion may include a generation surface whose side where a magnetic field is generated is a front surface and the other side is a back surface. In this case, the first main magnetic pole portion may be arranged annularly on the back surface side of an edge portion of the generation surface. Further, the second main magnetic pole portion may be arranged linearly on the back surface side of a center portion of the generation surface. Furthermore, the first secondary magnetic pole portion may be arranged annularly while surrounding the second main magnetic pole portion. Furthermore, the second secondary magnetic pole portion may be arranged linearly on an inner side of the first main magnetic pole portion.

By providing the main magnetic pole portions and the secondary magnetic pole portions as described above, the main magnetic field can be formed in a direction parallel to a front surface direction of an object arranged on the generation surface, for example.

The magnetic field generation apparatus may further include a holding portion configured to movably hold the plurality of first divisional magnets.

With this structure, by operating the holding portion as appropriate, the positions of the plurality of first divisional magnets can be adjusted with ease. As a result, the distribution of the main magnetic field can be adjusted with ease.

According to an embodiment of the present disclosure, there is provided a sputtering apparatus including a vacuum chamber, a substrate support portion, a target, a magnetic field generation portion, and a potential application portion.

The substrate support portion is provided inside the vacuum chamber.

The target opposes the substrate support portion.

The magnetic field generation portion includes two or more main magnetic pole portions, one or more secondary magnetic pole portions, and a yoke portion.

The two or more main magnetic pole portions generate a main magnetic field on a front surface of the target.

The one or more secondary magnetic pole portions include a plurality of first divisional magnets obtained by a division, that generate a secondary magnetic field for adjusting the generated main magnetic field.

The yoke portion includes one or more first yokes opposing the plurality of first divisional magnets in correspondence with the one or more secondary magnetic pole portions.

The potential application portion is configured to apply a negative potential to the target.

By the magnetic field generation portion, a magnetic field can be adjusted to be parallel on the front surface of the target. Accordingly, an erosion area of the target can be widened, and a use efficiency of the target can be improved. Moreover, since the distribution of the magnetic field generated by the magnetic field generation portion can be adjusted with ease, it becomes possible to generate an optimal magnetic field based on a type of the target and the like, for example.

As described above, according to the embodiments of the present disclosure, it is possible to provide a magnetic field generation apparatus capable of easily adjusting a magnetic field distribution and a sputtering apparatus that uses the magnetic field generation apparatus.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, an embodiment of the present disclosure will be described with reference to the drawings.

[Principle of Magnetron Sputtering]

Figure 1:
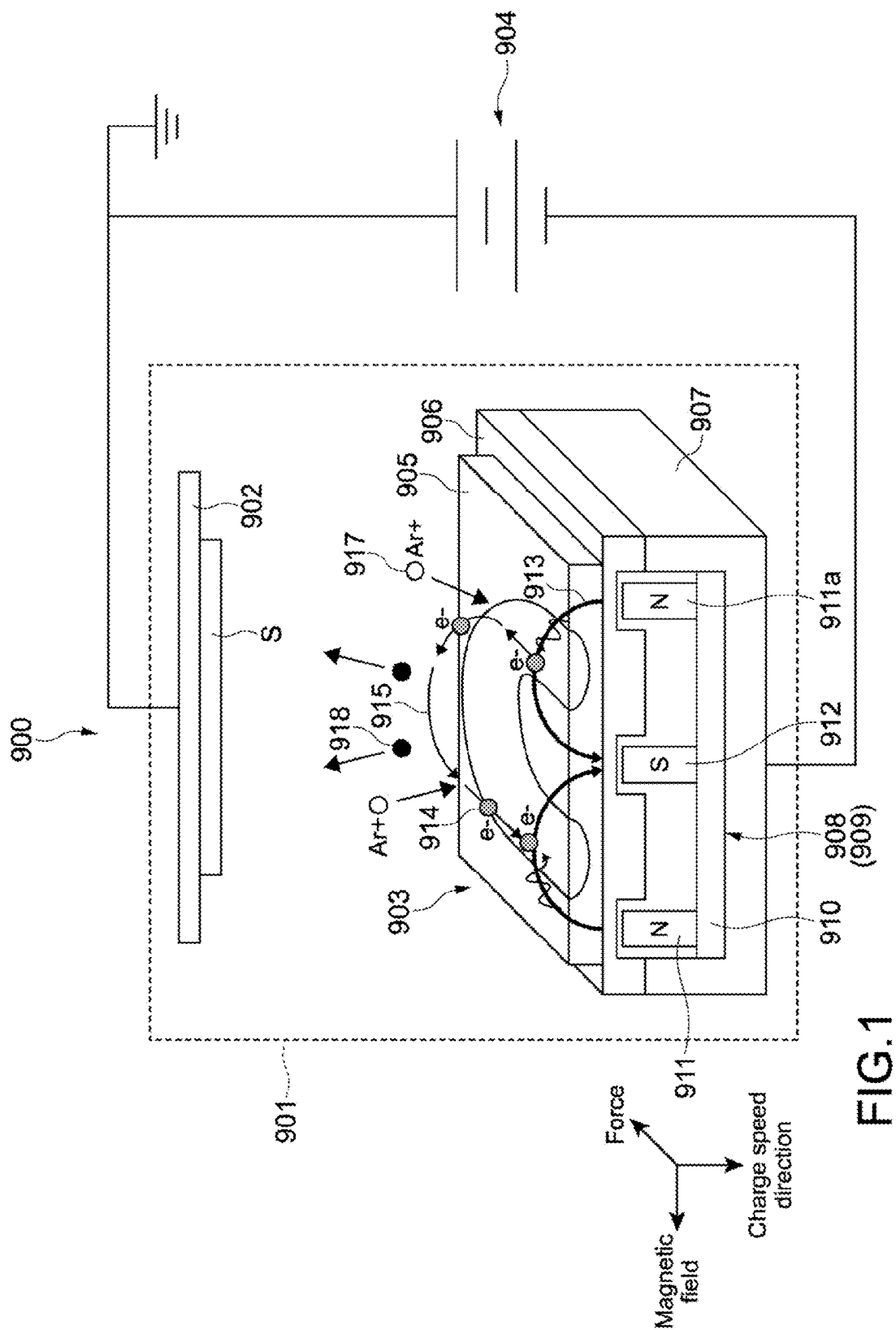
FIG. 1 is a schematic diagram for explaining a principle of magnetron sputtering.

For explaining a magnetic field generation apparatus and a magnetron sputtering apparatus according to the present disclosure, a principle of magnetron sputtering will first be described. FIG. 1 is a schematic diagram for explaining the principle of magnetron sputtering and shows a basic structure of a general magnetron sputtering apparatus. Hereinafter, the magnetron sputtering apparatus may simply be referred to as sputtering apparatus.

As shown in FIG. 1, the sputtering apparatus 900 includes, as a basic structure, a vacuum chamber 901, a substrate support portion 902 provided inside the vacuum chamber 901, a sputter cathode 903 provided while opposing the substrate support portion 902, and a DC power supply (potential application portion) 904.

In the vacuum chamber 901, a vacuum evacuation pipe and a gas pipe (not shown) are provided. A vacuum pump is connected to the vacuum evacuation pipe so that the inside of the vacuum chamber can be evacuated to a vacuum atmosphere. The gas pipe introduces process gas (hydrogen, oxygen, inert gas such as nitrogen and argon, reactive gas, etc.) into the vacuum chamber.

The substrate support portion 902 supports a substrate S such as a semiconductor wafer and a glass substrate to be a target of deposition processing. As shown in FIG. 1, the substrate support portion 902 is connected to a positive electrode of a DC electrode. Moreover, the substrate support portion 902 is connected to a ground potential.

The sputter cathode 903 includes a sputter target (hereinafter, simply referred to as target) 905, a backing plate 906, a frame 907, and a magnetic field generation portion 908. The target 905 is rectangular and connected to the backing plate 906. The backing plate 906 is connected to a negative electrode of the DC power supply 904 via the frame 907. It should be noted that a power supply other than the DC power supply may be used as the potential application portion.

The magnetic field generation portion 908 includes a magnetic circuit 909 for generating a magnetic field on a front surface of the target 905. The magnetic circuit 909 is constituted of a back yoke 910, a permanent magnet 911 annularly arranged (in a ring shape) on the back yoke 910, and a permanent magnet 912 linearly arranged (to be stick-like) at a center. The magnets 911 and 912 are arranged such that magnetic poles of different polarities face the backing plate 906.

In the example shown in FIG. 1, the annular permanent magnet 911 is arranged such that an N pole thereof is set on the backing plate 906 side. Further, the linear permanent magnet 912 is arranged such that an S pole thereof is set on the backing plate 906 side. Accordingly, a magnetic field line 913 as shown in FIG. 1 is formed on the front surface of the target 905. It should be noted that in descriptions below, the magnetic field and the magnetic field line may be denoted by the same reference numeral (e.g., magnetic field line 913 may be described as magnetic field 913).

When a high voltage of a negative electrode is applied to the backing plate 906 in the sputtering apparatus 900 as described above, electrons 914 are discharged from the front surface of the target 905. The electrons 914 are captured by the magnetic field line 913 on the front surface of the target 905 and perform a spiral movement (trochoid movement) by a Lorentz force. The electrons 914 captured by the magnetic field line 913 receives a force in a vector direction of the force shown in FIG. 1 (vector indicated by reference numeral 915) by a negative potential of the backing plate 906 and a horizontal component of the magnetic field 913 on the front surface of the target 905. The electrons 914 having a small mass are accelerated to high speed by receiving the force.

When the rectangular target 905 is used as shown in FIG. 1, the magnets 911 and 912 are arranged such that the electrons 914 move in a shape of a track that is substantially the same as a track used in track and field. Therefore, an electronic tunnel is formed in the track shape.

The inside of the vacuum chamber 901 is evacuated to a predetermined vacuum degree, and argon gas is introduced via the gas pipe. By the electrons 914 moving at high speed colliding with argon gas, argon atoms are excited to generate Ar+ (argon ion) 917. The Ar+ 917 excited to + is drawn to the target 905 as a negative potential and collides with the front surface of the target 905 at high speed. Accordingly, particles (sputter particles) 918 including atoms of the constituent material of the target 905 are discharged. The sputter particles 918 discharged from the front surface of the target 905 adhere onto the front surface of the opposing substrate S to thus form a thin film.

By the sputtering, the target 905 is gradually eroded. The target 905 is used until right before the thickness exceeds a usable range and is replaced with a new one after that. In the descriptions, how much the target 905 is used before needing to be replaced is referred to as a utilization ratio of the target 905. In other words, a ratio of the target 905 used for the deposition out of the unused target 905 is expressed as the utilization ratio. If the utilization ratio can be raised, the target 905 can be used effectively, thus resulting in a product cost cut and the like.

The erosion of the target 905 is caused by a collision of the Ar+ 917 with the target 905. Moreover, the Ar+ 917 is generated by a collision with the electrons 914 inside the electronic tunnel. When an electron density in the electronic tunnel is uneven, the Ar+ 917 to be excited also becomes uneven, and thus the erosion area of the target 905 also becomes uneven. Since a lifetime of the target 905 is rate-controlled by a deepest portion of an eroded portion, there is a need to uniformly cause an erosion in a wide area for raising the utilization ratio of the target 905. Therefore, it is required to make the electron density uniform across a wide range.

In the magnetic field generation apparatus and the sputtering apparatus below according to the present disclosure, a distribution of the magnetic field generated on the front surface of the target can be adjusted with ease. As a result, the utilization ratio of the target can be raised.

[Magnetic Field Generation Apparatus]

Figure 2:
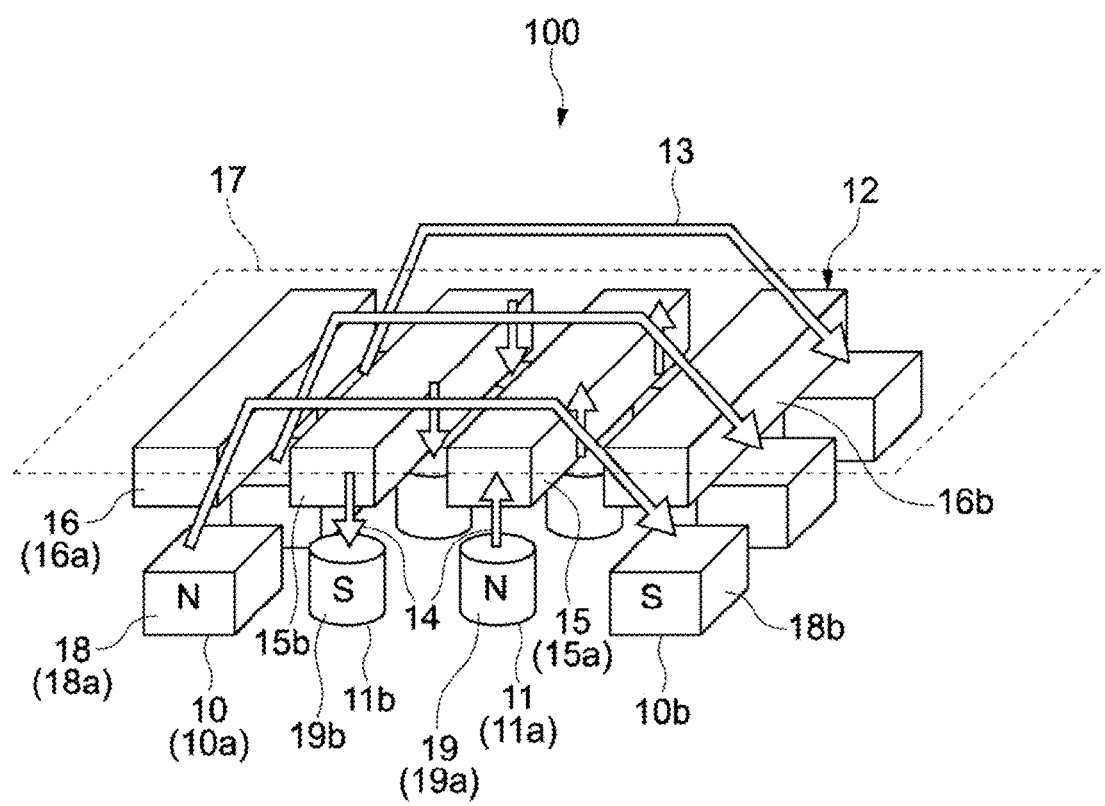
FIG. 2 is a schematic diagram showing a general outline of a magnetic field generation apparatus according to an embodiment of the present disclosure.

FIG. 2 is a schematic diagram showing a general outline of the magnetic field generation apparatus according to the embodiment of the present disclosure. The magnetic field generation apparatus 100 includes two or more main magnetic pole portions 10, one or more secondary magnetic pole portions 11, and a yoke portion 12. The two or more main magnetic pole portions 10 generate a main magnetic field 13. The one or more secondary magnetic pole portions 11 generate a secondary magnetic field 14 for adjusting the main magnetic field 13. The yoke portion 12 includes first yokes 15 arranged in correspondence with the one or more secondary magnetic pole portions 11 and second yokes 16 arranged in correspondence with the two or more main magnetic pole portions 10.

In the example shown in FIG. 2, as the two or more main magnetic pole portions 10, a first main magnetic pole portion 10a having an N pole on a generation portion 17 side as a generation position of the main magnetic field 13 and a second main magnetic pole portion 10b having an S pole on the generation portion 17 side are provided. The first main magnetic pole portion 10a and the second main magnetic pole portion 10b each include a plurality of divisional magnets 18. In other words, the first main magnetic pole portion 10a and the second main magnetic pole portion 10b are constituted of a magnet string in small pieces. The plurality of divisional magnets 18 included in the main magnetic pole portion 10 correspond to the second divisional magnets.

In the example shown in FIG. 2, the first main magnetic pole portion is structured by a plurality of divisional magnets 18a having N poles on the generation portion 17 side. In this embodiment, as the plurality of divisional magnets 18a, cuboid divisional magnets whose magnetic pole surface shape is rectangular are arranged. The same divisional magnets may be used as the plurality of divisional magnets 18a, or divisional magnets of different shapes or types may be used. For example, a neodymium magnet, ferrite core magnet, and the like are used as the divisional magnets 18a. Alternatively, an electric magnet or the like may be used.

The second main magnetic pole portion 10b is constituted of a plurality of divisional magnets 18b having S poles on the generation portion 17 side. Also as the plurality of divisional magnets 18b, cuboid magnets whose magnetic pole surface is rectangular are used. The main magnetic field 13 is formed by the first main magnetic pole portion 10a and the second main magnetic pole portion 10b arranged as described above, and the magnetic field line 13 is formed from the N pole surface of each of the divisional magnets 18a toward the S pole surface of the divisional magnets 18b.

In the example shown in FIG. 2, as the one or more secondary magnetic pole portions 11, a first secondary magnetic pole portion 11a having an N pole on the generation portion 17 side and a second secondary magnetic pole portion 11b having an S pole on the generation portion 17 side are provided. As shown in FIG. 2, the first secondary magnetic pole portion 11a is provided in the vicinity of the second main magnetic pole portion 10b between the first main magnetic pole portion 10a and the second main magnetic pole portion 10b. Further, the second secondary magnetic pole portion 11b is provided in the vicinity of the first main magnetic pole portion 10a between the first main magnetic pole portion 10a and the second main magnetic pole portion 10b.

The first secondary magnetic pole portion 11a and the second secondary magnetic pole portion 11b each include a plurality of divisional magnets 19. In other words, the first secondary magnetic pole portion 11a and the second secondary magnetic pole portion 11b are constituted of a magnet string in small pieces. The plurality of divisional magnets 19 included in the secondary magnetic pole portion 11 correspond to the first divisional magnets.

In the example shown in FIG. 2, the first secondary magnetic pole portion 11a is formed by a plurality of divisional magnets 19a having S poles on the generation portion 17 side. Moreover, the second secondary magnetic pole portion 11b is formed by the plurality of divisional magnets 19b having N poles on the generation portion 17 side. The plurality of divisional magnets 19a and 19b are constituted of cylindrical divisional magnets whose magnetic pole surface is circular. The number, shape, and the like of the plurality of divisional magnets 19 may be set arbitrarily. Typically, the secondary magnetic pole portion 11 generates the secondary magnetic field 14 for adjusting the main magnetic field 13. Therefore, magnets that have a smaller cross-sectional area and the like and a weaker magnetic force than the divisional magnets 18 arranged as the main magnetic pole portion 10 are used as the divisional magnets 19 arranged as the secondary magnetic pole portion 11. However, depending on the distribution of the magnetic field to be generated as the main magnetic field 13, the number and position of the divisional magnets, and the like, the magnetic force relationship is not limited to such a relationship.

In the example shown in FIG. 2, the main magnetic field 13 is pulled downwardly (direction from generation portion 17 to second secondary magnetic pole portion 11b) by the secondary magnetic field 14 generated by the second secondary magnetic pole portion 11b. In other words, at that portion, vertical components of the main magnetic field 13 on the upper side of the generation portion 17 move as if being pulled downwardly. On the other hand, the main magnetic field 13 is lifted upwardly (direction from first secondary magnetic pole portion 11a to generation portion 17) by the secondary magnetic field 14 generated by the first secondary magnetic pole portion 11a. In other words, vertical components of the main magnetic field 13 on the upper side of the generation portion 17 move upwardly. Accordingly, the main magnetic field 13 generated from the generation portion 17 can be made parallel on the upper side of the generation portion 17. As a result, as will be described below in detail, the utilization ratio of the target can be improved.

Further, since the first main magnetic pole portion 10a and the second main magnetic pole portion 10b that generate the main magnetic field 13 are constituted of the plurality of divisional magnets 18, the distribution of the main magnetic field 13, that is, the magnetic field line direction, a magnetic flux density, and the like can be adjusted with ease by appropriately adjusting the number, positions, and the like of the divisional magnets 18. Similarly, since the first secondary magnetic pole portion 11a and the second secondary magnetic pole portion 11b that generate the secondary magnetic field 14 are constituted of the plurality of divisional magnets 19, the intensity and distribution of the secondary magnetic field 14 can be adjusted with ease by appropriately adjusting the number, positions, and the like of the divisional magnets 19. Since the secondary magnetic field 14 can be adjusted with ease, the main magnetic field 13 can also be adjusted with ease.

The first yokes 15 of the yoke portion 12 are arranged so as to oppose the plurality of divisional magnets 19 in correspondence with the first secondary magnetic pole portion 11a and the second secondary magnetic pole portion 11b. In the example shown in FIG. 2, one first yoke 15a is provided between the divisional magnet 19a and the generation portion 17 on the upper side of the divisional magnet 19a of the first secondary magnetic pole portion 11a. Further, another first yoke 15b is provided between the divisional magnet 19b and the generation portion 17 on the upper side of the divisional magnet 19b of the second secondary magnetic pole portion 11b. The first yokes 15 are arranged so as to cover the arrangement area of the opposing divisional magnets 19. By providing the first yokes 15, the secondary magnetic field 14 generated by the plurality of divisional magnets 19 is averaged. Therefore, it becomes possible to prevent the secondary magnetic field 14 from becoming uneven. In other words, it is possible to prevent the magnetic field line and magnetic flux density as the secondary magnetic field 14 generated from the generation portion 17 from becoming uneven.

The second yokes 16 of the yoke portion 12 are arranged so as to oppose the plurality of divisional magnets 18 in correspondence with the first main magnetic pole portion 10a and the second main magnetic pole portion 10b. In the example shown in FIG. 2, one second yoke 16a is provided between the divisional magnet 18a and the generation portion 17 on the upper side of the divisional magnet 18a of the first main magnetic pole portion 10a. Further, another second yoke 16b is provided between the divisional magnet 18b and the generation portion 17 on the upper side of the divisional magnet 18b of the second main magnetic pole portion 10b. The second yokes 16 are arranged so as to cover the arrangement area of the opposing divisional magnets 18. By providing the second yokes 16, the main magnetic field 13 generated by the plurality of divisional magnets 18 is averaged. Therefore, it becomes possible to prevent the main magnetic field 13 from becoming uneven. In other words, it is possible to prevent the magnetic field line and magnetic flux density as the main magnetic field 13 generated from the generation portion 17 from becoming uneven.

As described above, according to the present disclosure, the plurality of divisional magnets 19 and the plurality of divisional magnets 18 are used for enabling the distribution and intensity of the secondary magnetic field 14 and the main magnetic field 13 to be adjusted with ease. The first yokes 15 are provided so as to oppose the plurality of divisional magnets 19. Moreover, the second yokes 16 are provided so as to oppose the plurality of divisional magnets 18. Accordingly, unevenness of the secondary magnetic field 14 generated by the plurality of divisional magnets 19 and unevenness of the main magnetic field 13 generated by the plurality of divisional magnets 18 are prevented from occurring. As a result, even when the numbers and positions of the plurality of divisional magnets 19 and the plurality of divisional magnets 18 are changed, the secondary magnetic field 14 and the main magnetic field 13 without unevenness can be generated appropriately.

Figure 3:
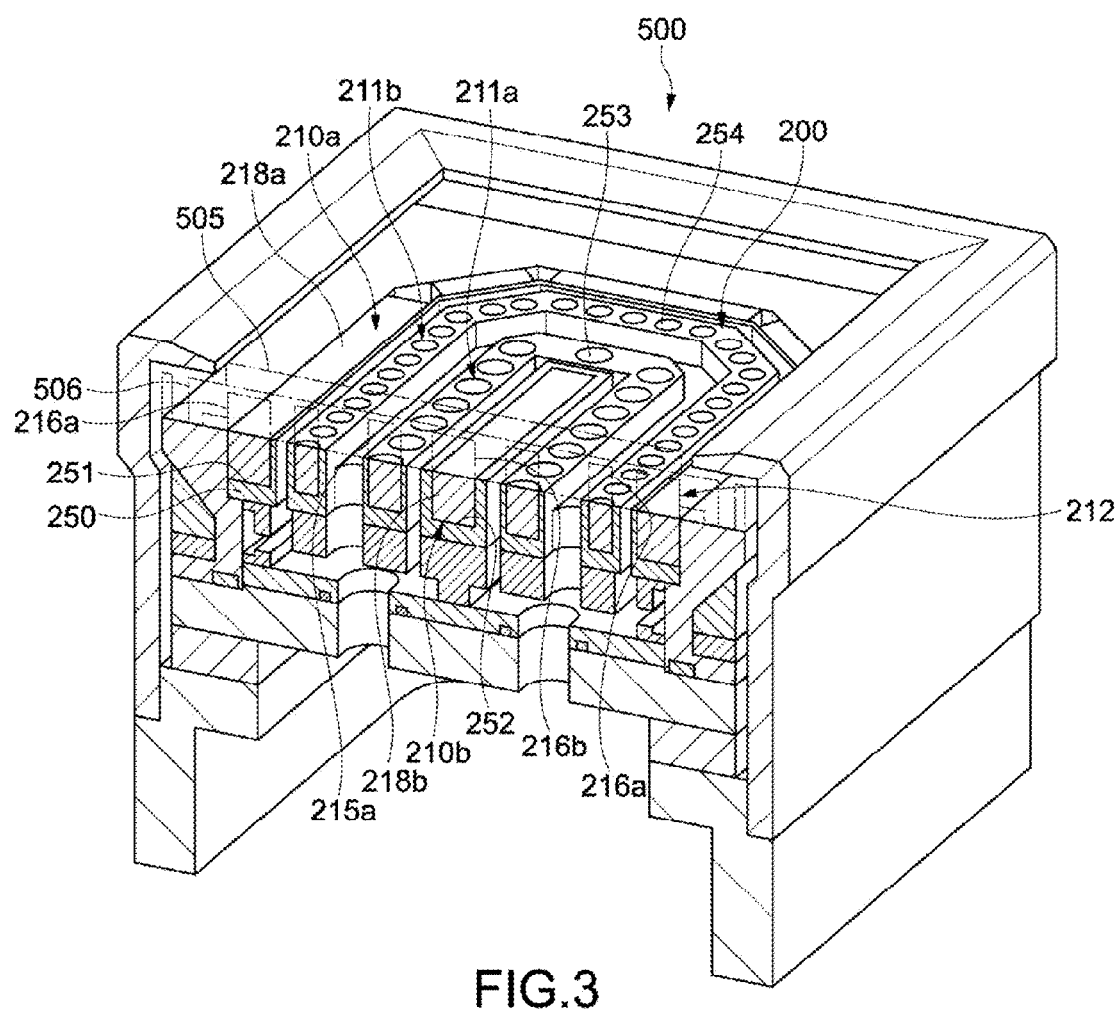
FIG. 3 is a perspective view showing a structural example of a sputter cathode of this embodiment.
Figure 4:
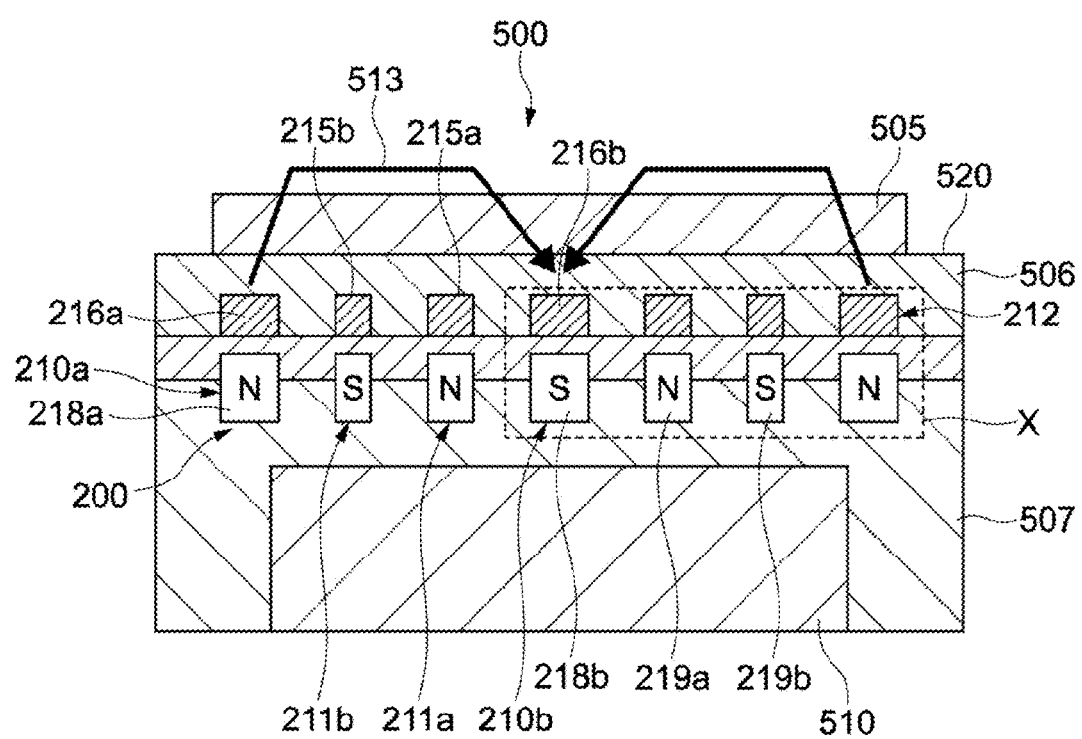
FIG. 4 is a cross-sectional diagram showing the structural example of the sputter cathode of this embodiment.

FIGS. 3 to 6 are diagrams each showing a structural example of a sputter cathode of this embodiment. In the sputter cathode 500, the magnetic field generation apparatus 100 whose general outline has been described above with reference to FIG. 2 is provided as a magnetic field generation portion 200. FIG. 3 is a cross-sectional diagram of the sputter cathode 500 seen in an oblique direction. FIG. 4 is a schematic diagram schematically showing the cross section. In FIG. 3, for explaining the structure of the magnetic field generation portion 200, illustrations of a target 505, a backing plate 506, and a yoke portion 212 are omitted (note that positional relationship is schematically shown in cross-sectional portion).

Figure 5:
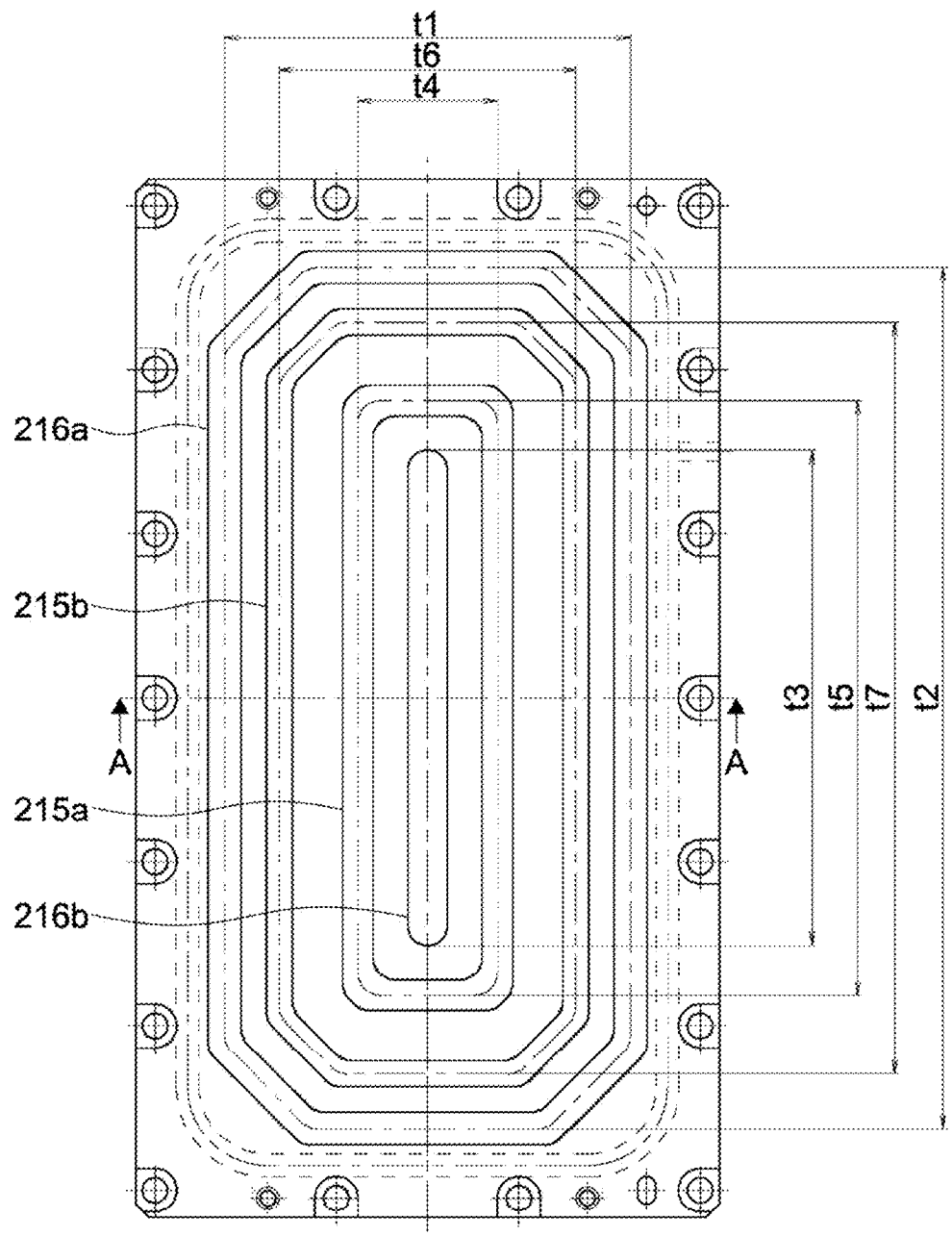
FIG. 5 is a plan view showing the structural example of the sputter cathode of this embodiment.
Figure 6:
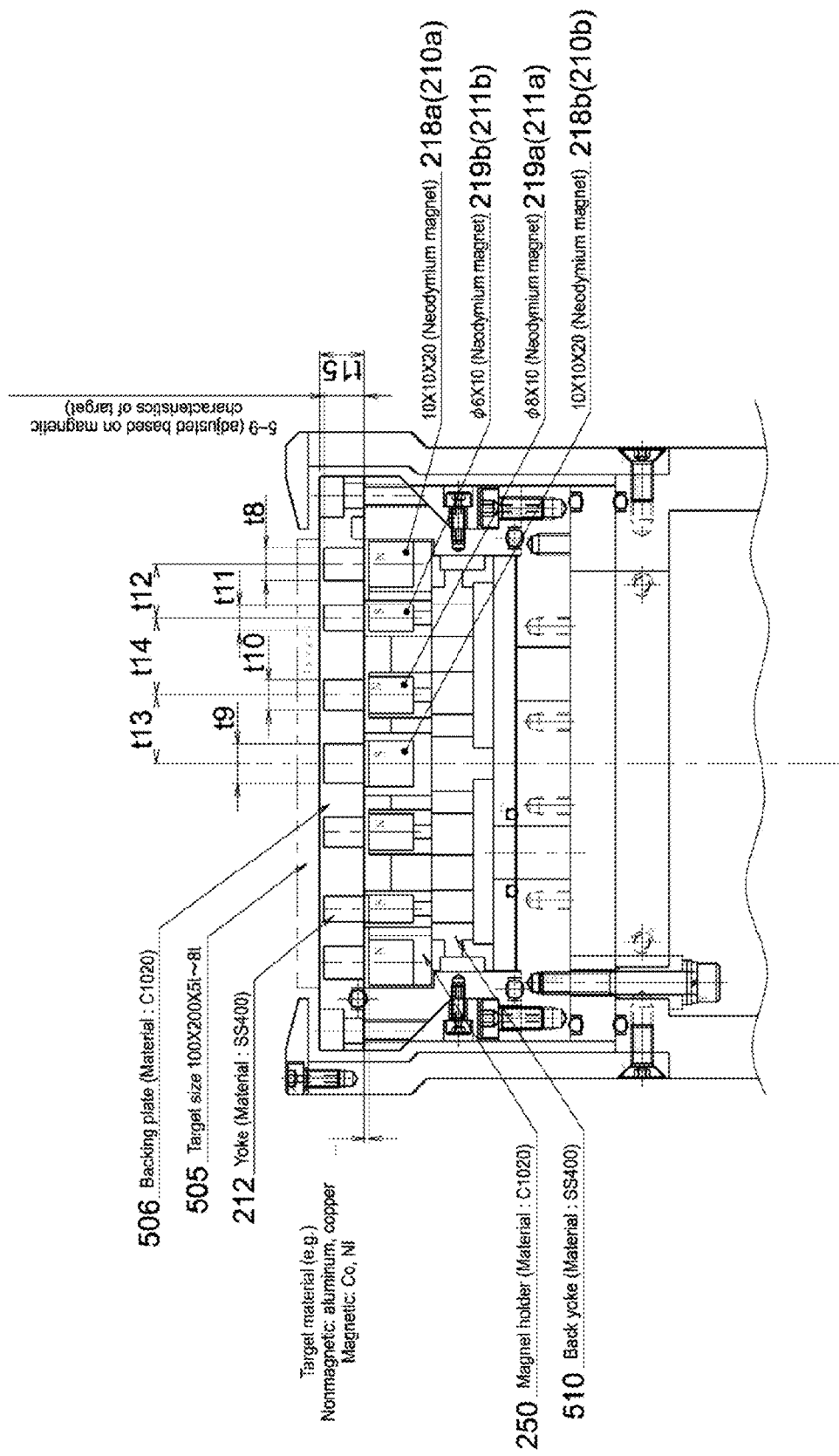
FIG. 6 is a cross-sectional diagram showing the structural example of the sputter cathode of this embodiment.

FIG. 5 is a plan view of the sputter cathode 500 seen from the upper direction. FIG. 6 is a cross-sectional diagram showing a cross section taken along the line A-A of FIG. 5. It should be noted that also in FIGS. 3 and 4, a portion corresponding to the cross section taken along the line A-A of FIG. 5 is shown. Further, in FIG. 6, to help understand the figure, the hatching is omitted.

The sputter cathode 500 includes the target 505, the backing plate 506, a frame 507, a back yoke 510, and the magnetic field generation portion 200. A front surface 520 of the backing plate 506 corresponds to a generation surface (hereinafter, referred to as generation surface 520) whose side where the magnetic field is generated is the front surface and the other side is the back surface. The target 505 is connected to the front surface of the generation surface 520.

The magnetic field generation portion 200 includes a first main magnetic pole portion 210a, a second main magnetic pole portion 210b, a first secondary magnetic pole portion 211a, a second secondary magnetic pole portion 211b, and a holding portion 250 that holds the divisional magnets of the magnetic pole portions. The first main magnetic pole portion 210a is annularly arranged on the back surface side of an edge portion of the generation surface 520. As shown in FIG. 3, at an edge portion of the holding portion 250 provided below the generation surface 520, an annular first attachment hole 251 is formed. The first attachment hole 251 is consecutively formed across the annular shape. The first main magnetic pole portion 210a is structured by inserting a plurality of divisional magnets 218a into the first attachment hole 251 and fixing them thereto. The first attachment hole 251 is an attachment area for attaching the plurality of divisional magnets 218a.

As shown in FIGS. 3 and 5, on the upper side of the plurality of divisional magnets 218a, a second yoke 216a is arranged. The second yoke 216a is arranged so as to cover the first attachment hole 251 formed on the holding portion 250. In other words, the lower side of the second yoke 216a shown in FIG. 5 becomes the attachment area for the divisional magnets 218a, and a desired number of divisional magnets 218a are arranged at desired positions. As a result, the main magnetic field 513 is generated from the second yoke 216a toward the upper side of the generation surface 520. It should be noted that in this embodiment, the first and second yokes 215 and 216 are incorporated into a backing yoke to be attached thereto.

The second main magnetic pole portion 210b is arranged linearly on the back surface side of the center portion of the generation surface 520. As shown in FIG. 3, at the center portion of the holding portion 250, a second attachment hole 252 is formed linearly. The second main magnetic pole portion 210b is structured by inserting a plurality of divisional magnets 218b into the second attachment hole 252 and fixing them thereto. The second attachment hole 252 is an attachment area for attaching the plurality of divisional magnets 218b. A second yoke 216b is arranged on the upper side of the divisional magnets 218b. The second yoke 216b is arranged so as to cover the second attachment hole 252.

The magnetic field line of the main magnetic field 513 is formed from the edge portion of the generation surface 520 toward the center portion.

It should be noted that the first main magnetic pole portion 210a and the second main magnetic pole portion 210b do not need to be constituted of the plurality of divisional magnets 218. Specifically, the first main magnetic pole portion 210a and the second main magnetic pole portion 210b may be constituted of one or a plurality of magnets that are constantly fixed. Even in such a case, by structuring the secondary magnetic pole portion 211 by the plurality of divisional magnets 219 such that the secondary magnetic field can be adjusted, the adjustment of the main magnetic field 513 can be realized with ease.

The first secondary magnetic pole portion 211a is annularly arranged so as to surround the second main magnetic pole portion 210b arranged at the center. As shown in FIG. 2, in the periphery of the second attachment hole 252 of the holding portion 250, a plurality of third attachment holes 253 are formed. The third attachment holes 253 are circular, and the first secondary magnetic pole portion 211a is structured by inserting the cylindrical divisional magnet 219a into the third attachment hole 253 at a desired position. Intervals of the third attachment holes 253 are arbitrary and determined based on, for example, a simulation. As shown in FIG. 5, a first yoke 215a is arranged on the upper side of the divisional magnet 219a. The first yoke 215a is arranged so as to cover the area where the third attachment holes 253 are formed, that is, the attachment area of the divisional magnets 219a.

The second secondary magnetic pole portion 211b is annularly arranged on the inner side of the first main magnetic pole portion 210a arranged at the edge portion. As shown in FIG. 2, a plurality of fourth attachment holes 254 are formed on the inner side of the first attachment hole 251 of the holding portion 250. The fourth attachment holes 254 are circular, and the second secondary magnetic pole portion 211b is structured by inserting the circular divisional magnet 219b into the fourth attachment hole 254 at a desired position. Intervals of the fourth attachment holes 254 can be set arbitrarily. Moreover, the sizes of the third attachment holes 253 and the fourth attachment holes 254 may be the same or may differ. The sizes of the third attachment holes 253 and the fourth attachment holes 254 only need to be determined based on the size of the divisional magnets 219 to be inserted.

As shown in FIG. 5, a first yoke 215b is arranged on the upper side of the divisional magnet 219b. The first yoke 215b is arranged so as to cover the area where the fourth attachment holes 254 are formed, that is, the attachment area of the divisional magnet 219b. By structuring the first main magnetic pole portion 210a and second main magnetic pole portion 210b and the first secondary magnetic pole portion 211a and second secondary magnetic pole portion 211b as described above, vertical components of the main magnetic field 513 can be set to be zero in a wide area of the front surface of the target 505 as shown in FIG. 4.

Referring to FIGS. 5 and 6, an example of the sizes (unit: mm) and materials of the sputter cathode of the present disclosure will be described. It should be noted that the sizes and materials are not limited to those below and can be set as appropriate.

Size t1 of first main magnetic pole portion 210a in short-side direction: 89

Size t2 of first main magnetic pole portion 210a in long-side direction: 189

Size t3 of second main magnetic pole portion 210b in long-side direction: 108.7

Size t4 of first secondary magnetic pole portion 211a in short-side direction: 30.6

Size t5 of first secondary magnetic pole portion 211a in long-side direction: 130.6

Size t6 of second secondary magnetic pole portion 211b in short-side direction: 65

Size t7 of second secondary magnetic pole portion 211b in long-side direction: 165

Width t8 of first main magnetic pole portion 210a: 7.3

Width t9 of second main magnetic pole portion 210b: 8.7

Width t10 of first secondary magnetic pole portion 211a: 6.7

Width t11 of second secondary magnetic pole portion 211b: 5.7

Interval t12 between first main magnetic pole portion 210a and second secondary magnetic pole portion 211b: 12

Interval t13 between second main magnetic pole portion 210b and first secondary magnetic pole portion 211a: 15.3

Interval t14 between first secondary magnetic pole portion 211a and second secondary magnetic pole portion 211b: 17.2

Thickness t15 of backing plate (thickness of first and second yokes 215 and 216): 10 (adjusted between 5 and 9 mm based on magnetic characteristics of target)

Divisional magnet 218a: 10*10*20 (neodymium magnet)

Divisional magnet 218b: 10*10*20 (neodymium magnet)

Divisional magnet 219a: ϕ8*10 (neodymium magnet)

Divisional magnet 219b: ϕ6*10 (neodymium magnet)

Backing plate 506: Oxygen-free copper (JIS code: C1020)

Magnet holder (holding portion 250): Oxygen-free copper (JIS code: C1020)

First and second yokes 215 and 216: Soft magnetic material (soft copper) (JIS code: SS400)

Back yoke 510: Soft magnetic material (soft copper) (JIS code: SS400)

The material of the target 505 is not particularly limited, and a nonmagnetic material such as aluminum and copper may be used, or a magnetic material such as cobalt and nickel may be used. In this embodiment, the target 505 having the size from 100*200*5 to 100*200*8 is used, though not limited thereto.

Figure 7:
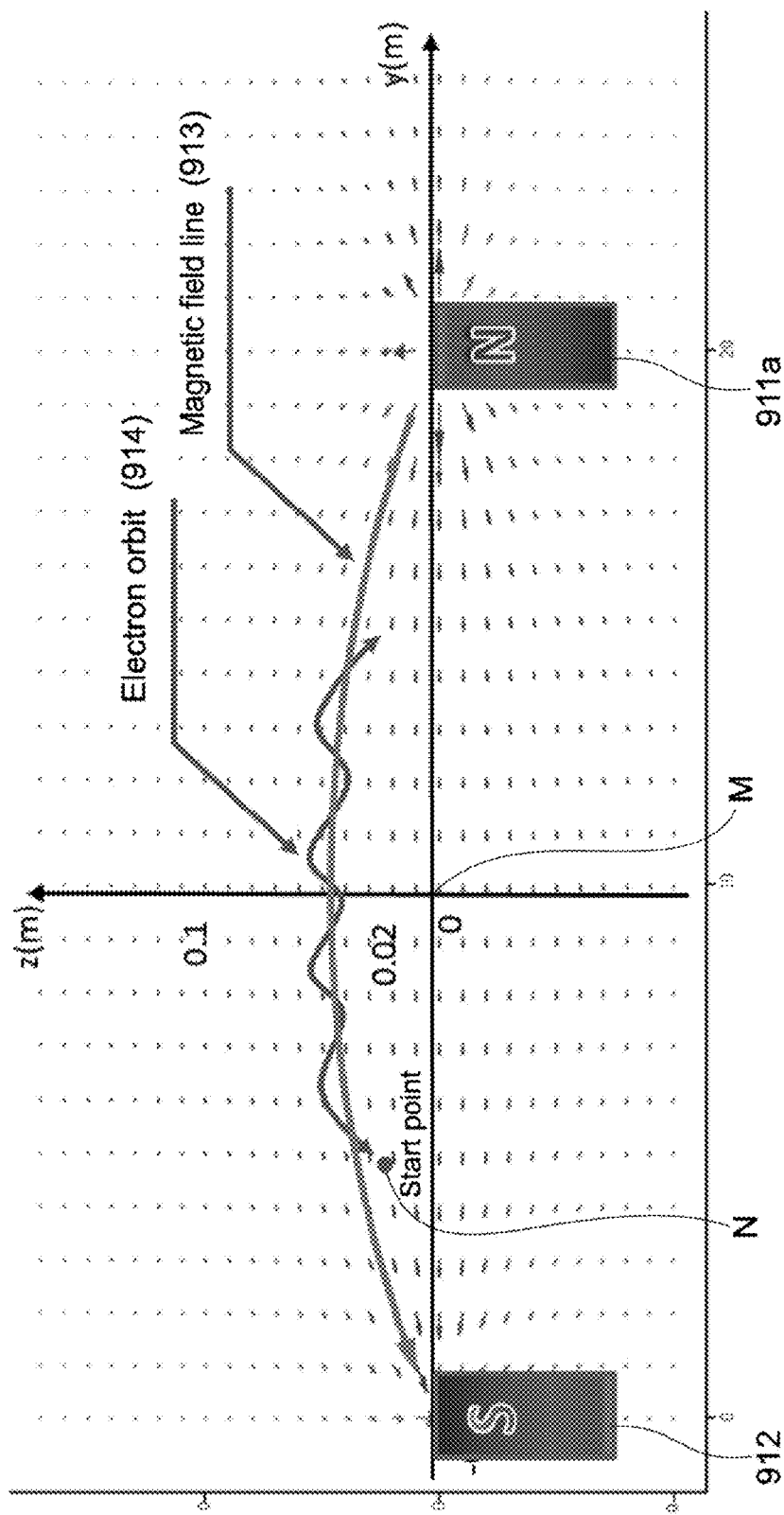
FIG. 7 is a graph showing a result of an orbit calculation of electrons in a general sputter cathode shown in FIG. 1.
Figure 8:
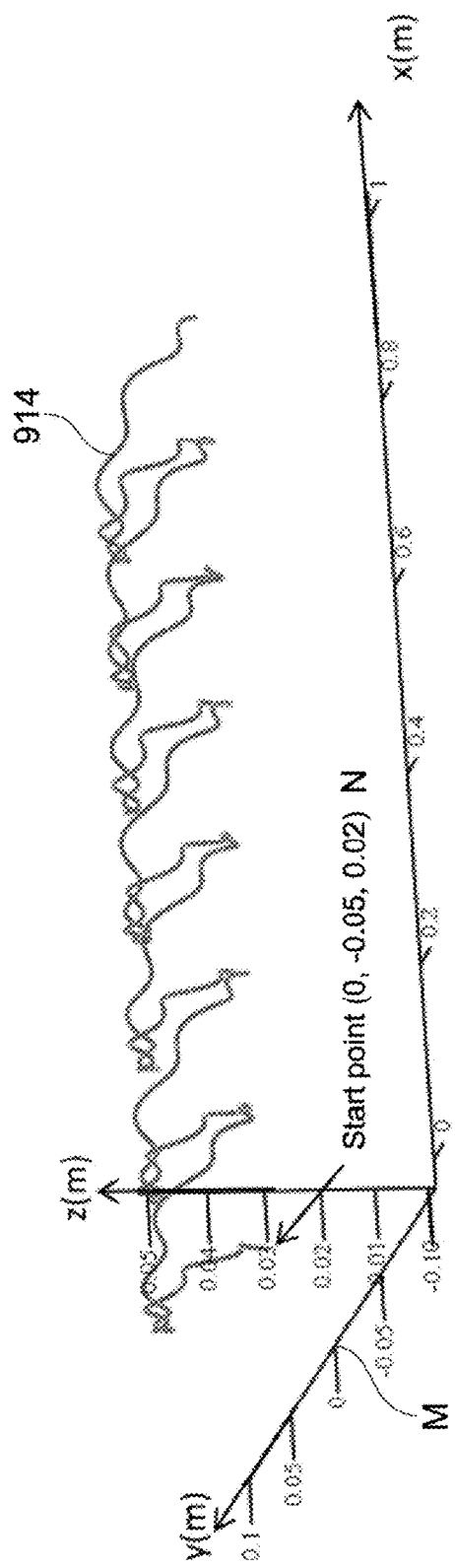
FIG. 8 is a graph showing a result of the orbit calculation of electrons in the general sputter cathode shown in FIG. 1.

Here, the magnetic field formed on the front surface of the target 505 and the erosion area will be described in detail. FIGS. 7 and 8 are each a graph showing a result of an orbit calculation of the electrons 914 in a general sputter cathode 903 shown in FIG. 1. Here, the right half area of the magnetic field generation portion 908 shown in FIG. 1 where the magnets 912 and 911a are arranged is used as the model in the calculation.

One electron 914 is started from a start point N in the vicinity of the magnet 912 where the S pole is set. While moving in a depth direction of FIG. 7 (x direction), the electron 914 is entangled in the magnetic field line 913 and moves toward the magnet 911a where the N pole is set. Upon moving to the same position as the start point N in a height direction (z direction), the electron 914 returns to the start point N. This return is performed with an intermediate point M between the magnets 912 and 911a being a center. It should be noted that since the orbit calculation does not take into account the attenuation due to a collision with argon atoms, the same amplitude is repeated. The force moving in the depth direction of the figure is the Lorentz force and is a vector product of a current vector obtained by the cathode (backing plate) to which a negative electrode has been applied and a magnetic field vector obtained by the magnets 912 and 911a.

In FIG. 8, the movement of the electron 914 is shown in a 3D graph. In the graph, the point set as the start point N is on the opposite side of the start point N shown in FIG. 7 from the intermediate point M. Also in this case, the electron 914 returns while being entangled in the magnetic field line 913 with the intermediate point M being the center and thus moves in the x direction corresponding to the depth direction of FIG. 7.

Next, the reason why the electron 914 reciprocates with the intermediate point M between the magnets 912 and 911a being the center will be described. Since the cathode is a negative electrode and the electron 914 also has a minus potential, a repelling force is generated by a coulomb force. Therefore, a position most distant from the front surface of the target, that is, the intermediate point M between the magnets 912 and 911a becomes a stable position for the moving electron 914. As a result, the electron 914 repetitively reciprocates with the intermediate point M being the center of the reciprocating movement. It should be noted that the reason why the electron 914 is entangled in the magnetic field line 913 is that, when the charge particles move within the magnetic field, a Lorentz force caused by the vector product of the current vector and the magnetic field vector acts as if being entangled in the magnetic field line 913.

As shown in the results of the orbit calculation of FIGS. 7 and 8, since the magnetic field line 913 on the front surface of the target 905 is curved in the general sputter cathode 903 as shown in FIG. 1, the electrons 914 are concentrated at the apex (stable position). As a result, since the Ar+ 917 excited by the electrons 914 is also concentrated at the apex, the erosion area due to the erosion of the target 905 is also concentrated at that portion. Accordingly, the utilization ratio of the target 905 is lowered.

Figure 9:
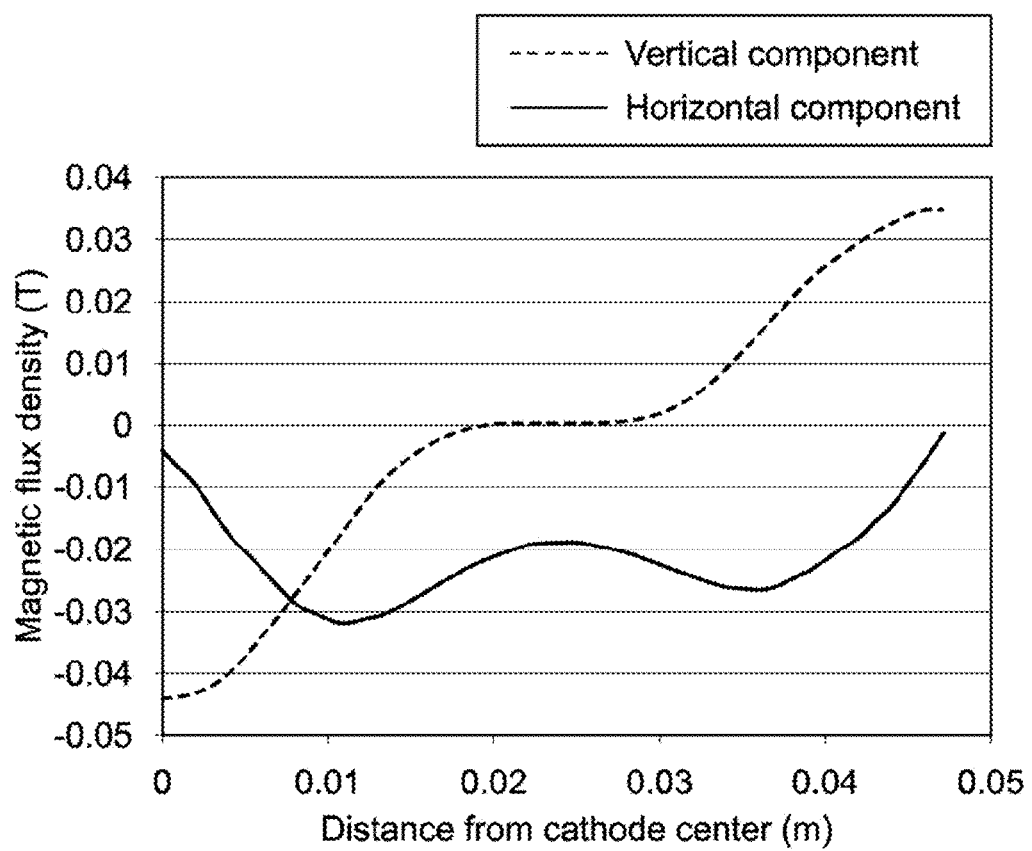
FIG. 9 is a graph showing measurement values of a magnetic flux density on a surface of a target in the sputter cathode including a magnetic field generation portion of this embodiment.

FIG. 9 is a graph showing measurement values of a magnetic flux density on the front surface of the target 505 in the sputter cathode 500 including the magnetic field generation portion 200 of this embodiment. Here, the magnetic flux density was measured in the sputter cathode 500 formed in/of the sizes and materials shown in FIGS. 5 and 6. The original point of the abscissa axis shown in FIG. 9 corresponds to the position of the second main magnetic pole portion 210b shown in FIG. 3. The magnetic flux density is measured in the area on the right-hand side of that position, and around 0.05 (m) of the abscissa axis corresponds to the position of the first main magnetic pole portion 210a.

As shown in FIG. 9, within the range from about 0.015 to 0.03 on the abscissa axis, an area where the vertical component of the magnetic flux density becomes zero is formed. A state where the horizontal component of the magnetic field line takes a certain value and the vertical component is zero means that the magnetic field line is completely parallel to the front surface of the target 505. In this case, as shown in FIG. 4, the magnetic field line 513 on the front surface of the target 505 becomes linear without being curved. In this case, since the magnetic field line 513 becomes horizontal on the front surface of the target 505, the electrons entangled in the magnetic field line 513 are widely dispersed in the horizontal area of the magnetic field line 513 without concentrating at one point even when receiving a coulomb force in the direction that parts from the target 505. In other words, it becomes possible to avoid the electrons concentrating at the apex of the curved magnetic field and make the electron density on the front surface of the target 505 uniform in a wide area.

Since the electrons moving at high speed are widely dispersed, Ar+ to be excited is also widely dispersed and collides with the target 505. Accordingly, the erosion area of the target 505 can be made uniform across a wide area, and thus the utilization ratio of the target 505 can be improved.

Figure 10:
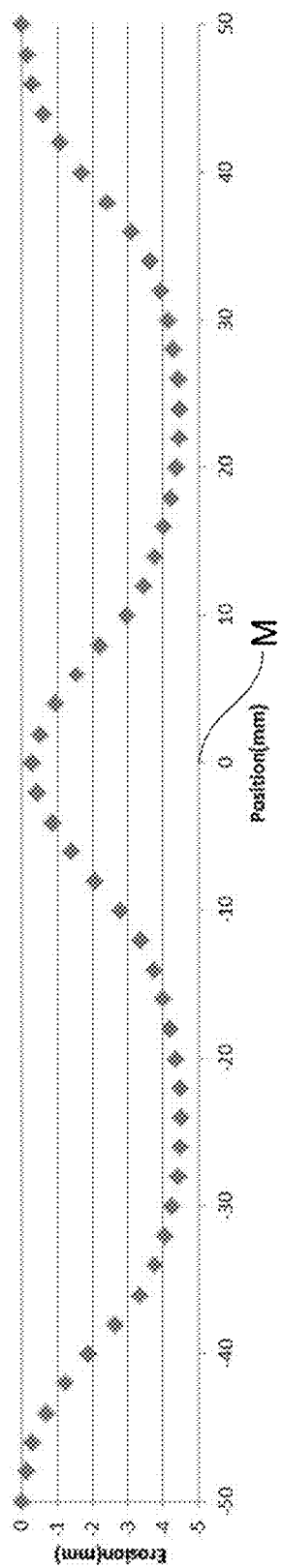
FIG. 10 is a graph obtained by measuring a cross-sectional shape of the target when the sputter cathode of this embodiment is used.

FIG. 10 is a graph obtained by measuring a cross-sectional shape of the target 505 when the sputter cathode 500 of this embodiment is used. As shown in FIG. 10, with the intermediate point M (original point) between the first main magnetic pole portion 210a and the second main magnetic pole portion 210b being the center, the erosion area was formed in a wide area, and the utilization ratio of the target 505 was about 60%. When the inventors of the present disclosure performed sputtering using the general structure shown in FIG. 1, the utilization ratio was about 10 to 25%. In other words, the utilization ratio was raised to be about 2.4 to 6 times the utilization ratio obtained by the general structure.

Figure 11:
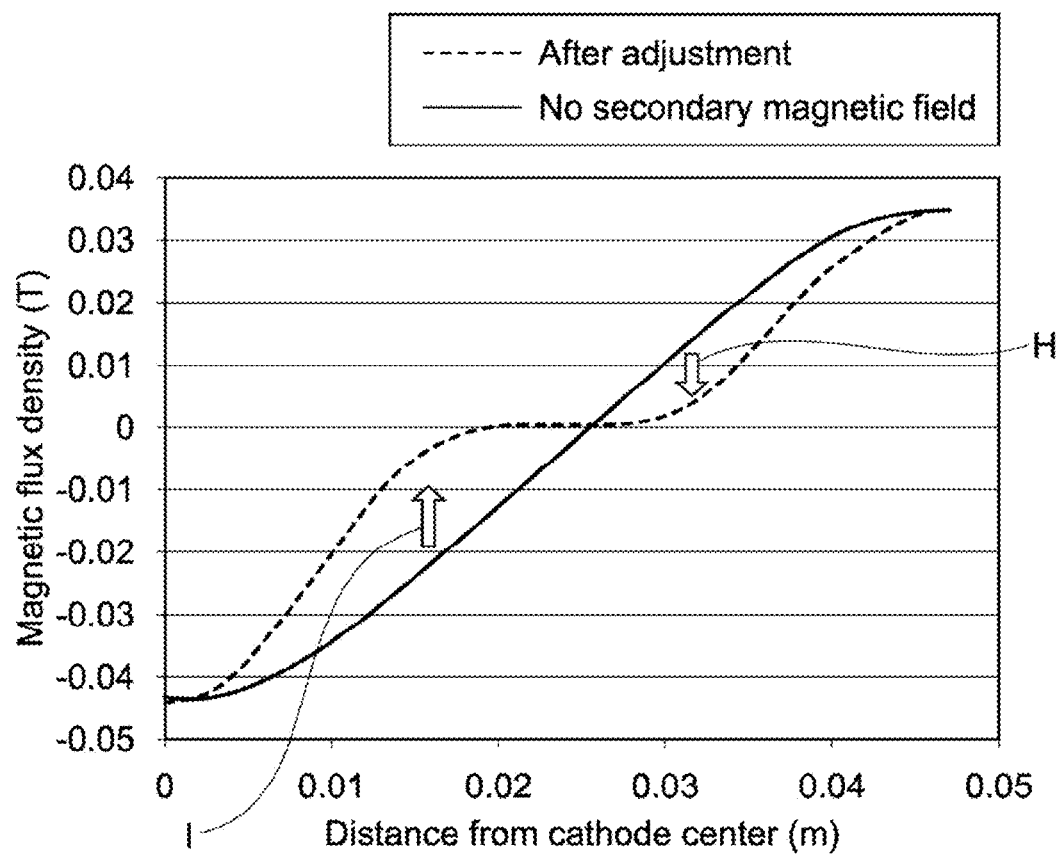
FIG. 11 is a graph for explaining a main magnetic field adjustment method for the magnetic field generation portion of this embodiment.

FIG. 11 is a graph for explaining the main magnetic field adjustment method for the magnetic field generation portion 200 of this embodiment. The graph shown in FIG. 11 also shows the magnetic flux densities on the right-hand side area of the magnetic field generation portion 200. The adjustment method will be described while referring to the structures of the first main magnetic pole portion 210a and second main magnetic pole portion 210b on the right-hand side surrounded by a broken line X of FIG. 4 and the first secondary magnetic pole portion 211a and second secondary magnetic pole portion 211b.

For example, a state where only the first main magnetic pole portion 210a and the second main magnetic pole portion 210b are provided will be discussed. In this case, the magnetic flux density of the vertical magnetic field on the front surface of the target 505 changes almost linearly as indicated by the solid line in the graph. When the first secondary magnetic pole portion 211a is provided in the vicinity of the second main magnetic pole portion 210b from that state, the vertical component moves as if being pulled downwardly in that area (arrow H). Moreover, when the second secondary magnetic pole portion 211b is provided in the vicinity of the first main magnetic pole portion 210a, the vertical component moves upwardly in that area (arrow I). By appropriately arranging the secondary magnetic pole portion 211, the main magnetic field can be adjusted.

The first secondary magnetic pole portion 211a and the second secondary magnetic pole portion 211b each include the plurality of divisional magnets 219 in small pieces, and the number and positions thereof can be adjusted as appropriate. Accordingly, the main magnetic field can be adjusted with ease, and an area where the vertical component becomes zero can be formed. Although intervals are provided among the plurality of divisional magnets 219, since the secondary magnetic field to be generated is averaged by the first yokes 215 provided on the upper side of the secondary magnetic pole portion 211, the main magnetic field on the front surface of the target 505 does not become uneven.

When wishing to adjust the magnetic flux density or horizontal component of the area where the component of the vertical magnetic field becomes zero, the number of divisional magnets 218 of the first main magnetic pole portion 210a and second main magnetic pole portion 210b, or the like only needs to be changed as appropriate. In accordance with that, the first secondary magnetic pole portion 211a and second secondary magnetic pole portion 211b only need to be adjusted as appropriate so that the area where the vertical component becomes zero is formed. As described above, since the magnetic field generation apparatus according to the present disclosure includes the mechanism with which the main magnetic field can be adjusted, even when targets 505 having different magnetic characteristics are used, for example, the main magnetic field can be optimized with a single sputter cathode 500 to thus improve the utilization ratio of the target 505.

Heretofore, in the magnetic field generation apparatus 100 (magnetic field generation portion 200) of this embodiment, the main magnetic pole portion 210 and the secondary magnetic pole portion 211 have been structured by the plurality of divisional magnets and the yokes opposing the magnets. For example, yokes formed of a magnetic material may be arranged on a magnet string in small pieces so as to form a magnet unit. By arranging such a unit as the main magnetic pole portion 210 and the secondary magnetic pole portion 211, the direction of the magnetic field line and the magnetic flux density on an upper arbitrary surface can be adjusted to desired values.

As described above, when this technique is applied to a target cathode in the magnetron sputtering apparatus, the magnetic field line on the front surface of the target 505 can be adjusted to be parallel to the front surface of the target with ease. As a result, it becomes possible to widen the erosion area of the target 505 and improve the utilization ratio of the target 505.

Regarding the direction of the magnetic field line and the magnetic flux density, a desired magnetic field can be easily adjusted by changing the numbers and positions of the divisional magnets included in the magnetic pole portions. Moreover, also by appropriately setting the combination of the divisional magnets and the yokes, the magnetic field can be adjusted. Since the magnetic field line passes through the target 505 and is affected by the magnetic characteristics of the target 505, the adjustment is required for each target 505. By using the magnetic field generation apparatus 100 according to the present disclosure, a plurality of targets 505 having different magnetic characteristics can be handled by a single sputter cathode 500.

By improving the utilization ratio of the target 505, development costs and product costs can be cut. Moreover, since the plurality of targets 505 can be handled, the number of cathodes can be reduced, thus leading to a facility cost cut. Further, a replacement cycle of the target 505 can be prolonged, and the facility operation rate can be raised. In addition, the number of tasks for replacing the target 505 can be reduced. According to the magnetic field generation apparatus 100 according to the present disclosure that functions as a magnetic field adjustment mechanism, a desired magnetic field can be realized without remaking the sputter cathode. Moreover, by the yokes arranged for each magnetic pole portion, an even and uniform magnetic field can be formed.

In Japanese Patent No. 4845836 (hereinafter, referred to as Patent Document 1) above, the vertical magnetic field on the front surface of the target crosses zero 3 times (horizontal magnetic field of about 150 to 200 gauss, zero level is within ±10 gauss). However, in Patent Document 1, a magnetic material corresponding to the yoke of the present disclosure is not provided above the magnet. Moreover, a mechanism for adjusting the magnetic field (direction of magnetic field line and magnetic flux density of horizontal magnetic field) is also not provided. For causing the vertical magnetic field to cross zero 3 times within a narrow range of the zero level (±10 gauss) as disclosed in Patent Document 1, subtle control of the magnetic field is required. It is considered extremely difficult to realize the 3-time zero cross in the structure with no mechanism for adjusting a magnetic field. Since the shape and position of the magnets to be arranged in the sputter cathode are limited, the 3-time zero cross cannot be realized unless remaking the sputter cathode several times while changing a magnetic intensity of the magnets. Further, since there is no mechanism for adjusting the magnetic field, the sputter cathode cannot handle a plurality of targets having different magnetic characteristics. Furthermore, in the sputter cathode disclosed in Patent Document 1, the magnetic flux density of the horizontal magnetic field cannot be adjusted. The magnetic flux density of the horizontal magnetic field is in correlation with application voltage power. Therefore, if the magnetic flux density of the horizontal magnetic field changes, the application voltage is varied even in the deposition processing at the same deposition rate, with the result that the film quality of the deposited sputter film is changed. Since the application voltage is determined unambiguously as the deposition rate is set in the deposition mechanism disclosed in Patent Document 1, the voltage cannot be changed at a constant rate. In the case of a thin film in which a voltage affects the film quality, there arises a problem since the voltage cannot be controlled.

In Japanese Patent Application Laid-open No. 2006-16634 (hereinafter, referred to as Patent Document 2), although the shunt plate is provided above the area between the magnets, this is apparently for a purpose different from that of the yokes of the present disclosure. The shunt plate is arranged so that the vertical magnetic field on the target surface becomes zero and is not provided for the purpose of averaging the magnetic field generated from the magnets nor are there descriptions or indications of it. Since there is no mechanism for adjusting the magnetic field also in the magnetic field generation apparatus disclosed in Patent Document 2, there is a problem common to that of the sputter cathode disclosed in Patent Document 1. Further, since the target and the shunt plate are close to each other, the magnetic field is largely deviated from its ideal shape along with the progress of the target erosion, with the result that it is presumed that the utilization ratio of the target eventually does not rise that much.

In contrast, in the magnetic field generation apparatus and sputtering apparatus according to the present disclosure, the magnetic field distribution can be adjusted with ease, and when used in a sputter cathode, the utilization ratio of the target can be sufficiently improved.

Other Embodiments

The present disclosure is not limited to the embodiment described above, and various other embodiments can also be realized.

In the descriptions above, the magnetic field generation apparatus of the present disclosure has been used for adjusting the main magnetic field formed on the front surface of the target to be parallel. However, the use of the magnetic field generation apparatus is not limited to the case of generating a main magnetic field. The magnetic field generation apparatus according to the present disclosure is not limited to the case of being used in a sputter cathode and is applicable to various purposes in various fields. Using the magnetic field generation apparatus according to the present disclosure, various magnetic fields having desired distributions can be formed as the main magnetic field.

For forming a desired main magnetic field as the magnetic field generation apparatus according to the present disclosure, a plurality of magnet units constituted of divisional magnets and yokes only need to be arranged. At this time, which of the main magnetic pole portion and the secondary magnetic pole portion each of the magnet units is to be used does not need to be clearly distinguished. In other words, a structure in which predetermined magnet units exert both the function as the main magnetic pole portion and the function as the secondary magnetic pole portion is included in the idea of the present disclosure. A plurality of magnet units that at least function as two or more main magnetic pole portions and one or more secondary magnetic pole portions only need to be provided.

By the magnetic field generation apparatus according to the present disclosure, it is possible to generate not only the magnetic field in which the vertical component becomes zero but also a curved magnetic field as shown in FIG. 7 as necessary, or cause the 3-time zero cross. According to purposes, the direction of magnetic field line and the magnetic flux density can be adjusted as appropriate.

The number of columns, shapes, and the like regarding the structure of the magnetic field generation apparatus according to the present disclosure are not limited to those shown in FIG. 4. Moreover, the arrangement of the main magnetic pole portion and the secondary magnetic pole portion is not limited to that which enables electrons to move in a track shape. The shape in which the main magnetic pole portion and the secondary magnetic pole portion are arranged can be set as appropriate to a rectangular shape, a circular shape, a curved shape, and the like. Moreover, depending on the magnetic field to be generated, the yoke does not need to be provided right above the plurality of divisional magnets. In other words, although the yoke has been provided between the divisional magnet and the generation portion in the descriptions above, the yoke may be arranged so as to obliquely oppose the plurality of divisional magnets from a position slightly having an angle with respect to a direction in which the magnetic field is to be generated.

Further, the main magnetic pole portion and the secondary magnetic pole portion do not need to be arranged on the same plane. For example, it is assumed that the first and second main magnetic pole portions are arranged on the same plane, and an object as a magnetic field application target is provided above that plane. In such a case, one or more secondary magnetic pole portions may be provided on an upper side of the object (opposite side of first and second main magnetic pole portions). Further, the generation surface of the main magnetic field from the main magnetic pole portion and the generation surface of the secondary magnetic field from the secondary magnetic pole portion do not need to be arranged on the same plane. Furthermore, the secondary magnetic pole portion may be arranged between the first and second main magnetic pole portions such that the N pole is set on the first main magnetic pole portion side and the S pole is set on the second main magnetic pole portion side, for example. The positional relationship between the main magnetic pole portion and the secondary magnetic pole portion can be set arbitrarily.

The adjustment of the magnetic field is performed using, for example, a gaussmeter. In addition, the magnetic field measurement method is arbitrary.

In the descriptions above, the divisional magnets are fixed at desired positions by the holding portion 250 in which the first to fourth attachment holes 251 to 254 are formed as shown in FIG. 3. A holding portion that movably holds the divisional magnets may be provided in place of the holding portion as described above. For example, a structure in which the attachment holes are movable may be used, or the divisional magnets may be held by a material having mobility and the position of the divisional magnets may be changed in that held state. An arbitrary structure may be adopted as the structure for individually moving the divisional magnets. By operating the holding portion as appropriate, the positions of the divisional magnets can be adjusted with ease, and thus the distribution of the main magnetic field can be adjusted with ease. For example, by using the structure in which the positions of the divisional magnets can be changed by being controlled from outside, the adjustment of the magnetic field can be realized easily and highly accurately while feeding back the measurement result of the magnetic field.

Of the feature portions described in the embodiments above, at least two feature portions can be combined.

It should be noted that the present disclosure may also take the following structures.

(1) A magnetic field generation apparatus, including:
two or more main magnetic pole portions configured to generate a main magnetic field;
one or more secondary magnetic pole portions including a plurality of first divisional magnets obtained by a division, that generate a secondary magnetic field for adjusting the generated main magnetic field; and
a yoke portion including one or more first yokes opposing the plurality of first divisional magnets in correspondence with the one or more secondary magnetic pole portions.

(2) The magnetic field generation apparatus according to (1) above, in which:
the two or more main magnetic pole portions each include a plurality of second divisional magnets obtained by a division; and
the yoke portion includes two or more second yokes opposing the plurality of second divisional magnets in correspondence with the two or more main magnetic pole portions.

(3) The magnetic field generation apparatus according to (2) above, further including
a generation portion that is a generation position of the main magnetic field,
in which:
the two or more main magnetic pole portions include a first main magnetic pole portion having an N pole on the generation portion side and a second main magnetic pole portion having an S pole on the generation portion side;
the one or more secondary magnetic pole portions include a first secondary magnetic pole portion that is provided in the vicinity of the second main magnetic pole portion between the first main magnetic pole portion and the second main magnetic pole portion and has an N pole on the generation portion side and a second secondary magnetic pole portion that is provided in the vicinity of the first main magnetic pole portion between the first main magnetic pole portion and the second main magnetic pole portion and has an S pole on the generation portion side;
the one or more first yokes are provided between the plurality of first divisional magnets and the generation portion; and
the two or more second yokes are provided between the plurality of second divisional magnets and the generation portion.

(4) The magnetic field generation apparatus according to (3) above, in which:

the generation portion includes a generation surface whose side where a magnetic field is generated is a front surface and the other side is a back surface;
the first main magnetic pole portion is arranged annularly on the back surface side of an edge portion of the generation surface;
the second main magnetic pole portion is arranged linearly on the back surface side of a center portion of the generation surface;
the first secondary magnetic pole portion is arranged annularly while surrounding the second main magnetic pole portion; and
the second secondary magnetic pole portion is arranged linearly on an inner side of the first main magnetic pole portion.

(5) The magnetic field generation apparatus according to any one of (1) to (4) above, further including
a holding portion configured to movably hold the plurality of first divisional magnets.

It should be understood by those skilled in the art that various modifications, combinations, sub-combinations and alterations may occur depending on design requirements and other factors insofar as they are within the scope of the appended claims or the equivalents thereof.

What is claimed is:
1. A magnetic field generating apparatus, comprising:
(a) a first main magnetic pole portion comprised of a first plurality of first divisional magnets;
(b) a second main magnetic pole portion comprised of a second plurality of first divisional magnets;
(c) a first secondary magnetic pole portion comprised of a first plurality of second divisional magnets;
(d) a second secondary magnetic pole portion comprised of a second plurality of second divisional magnets;
(e) a back yoke;
(f) a first main magnetic pole yoke portion;
(g) a second main magnetic pole yoke portion;
(h) a first secondary magnetic pole yoke portion;
(i) a second secondary magnetic pole yoke portion,
wherein,
the first and second main magnetic pole portions generate a main magnetic field,
the first and second secondary magnetic pole portions generate a secondary magnetic field to adjust the main magnetic field,
the first plurality of first divisional magnets are arranged in a first effective annulus;
the second plurality of first divisional magnets are linearly arranged along an axis of the first effective annulus,
the first plurality of second divisional magnets are arranged in a second effective annulus and positioned between the first plurality of first divisional magnets and the second plurality of first divisional magnets,
the second plurality of second divisional magnets are arranged in a third effective annulus and positioned between the first plurality of second divisional magnets and the second plurality of first divisional magnets,
the back yoke is located at first sides of the first main magnetic pole portion, the second main magnetic pole portion, the first secondary magnetic pole portion, and the second secondary magnetic pole portion,
the first main magnetic pole yoke portion (a) is located at a second side of the first magnetic pole portion, which second side faces away from the first side of the first magnetic pole portion, and (b) overlies the first plurality of first divisional magnets, the second main magnetic pole yoke portion (a) is located at a second side of the second magnetic pole portion, which second side faces away from the first side of the second magnetic pole portion, and (b) overlies the second plurality of first divisional magnets, the first secondary magnetic pole yoke portion (a) is located at a second side of the first secondary magnetic pole portion, which second side faces away from the first side of the of the first secondary magnetic portion, and (b) overlies the first plurality of second divisional magnets, the second secondary magnetic pole yoke portion is (a) located at a second side of the second secondary magnetic pole portion, which second side faces away from the first side of the second secondary magnetic pole portion, and (b) overlies the second plurality of second divisional magnets, each of first main magnetic pole yoke portion, the second main magnetic pole yoke portion, the first secondary magnetic pole yoke portion, and the second secondary magnetic pole yoke portion respectively comprises one or more yokes made of a soft magnetic material.

2. The magnetic field generation apparatus according to claim 1, further comprising a generation portion side where the main magnetic field is generated, wherein:

the generation portion is located at the second sides of the first and second main magnetic pole portions;

one of the first or second main magnetic pole portions has an N pole at its second side while the other of the first or second main magnetic pole portions has an S pole at its second side; and one of the first or second secondary magnetic pole portions has an N pole at its second side while the other of the first or second secondary magnetic pole portions has an S pole at its second side and the second main magnetic pole portion and has an S pole on the generation portion side.

3. The magnetic field generation apparatus according to claim 2, wherein each annulus is an oval.

4. The magnetic field generation apparatus according to claim 1, further comprising a holding portion configured to removably hold the first and second pluralities of second divisional magnets.

5. A sputtering apparatus, comprising:
a vacuum chamber;
a substrate support portion provided inside the vacuum chamber;
a target opposing the substrate support portion;
a magnetic field generation according to claim 1.

6. The magnetic field generation apparatus of claim 1, wherein the soft magnetic material is soft copper.

7. The sputtering apparatus of claim 5, wherein the soft magnetic material is soft copper.

8. The magnetic field generation apparatus of claim 1, wherein the first divisional magnets are rectangular shape and the second divisional magnets are cylindrical in shape.

9. The sputtering apparatus of claim 5, wherein the first divisional magnets are rectangular shape and the second divisional magnets are cylindrical in shape.

10. The magnetic field generation apparatus of claim 1, wherein the second divisional magnets of the first plurality of second divisional magnets and the second divisional magnets of the second plurality of second divisional magnetics are of different sizes.

11. The sputtering apparatus of claim 5, wherein the second divisional magnets of the first plurality of second divisional magnets and the second divisional magnets of the second plurality of second divisional magnetics are of different sizes.

12. The magnetic field generation apparatus of claim 8, wherein the second divisional magnets of the first plurality of second divisional magnets and the second divisional magnets of the second plurality of second divisional magnetics are of different diameters.

13. The sputtering apparatus of claim 9, wherein the second divisional magnets of the first plurality of second divisional magnets and the second divisional magnets of the second plurality of second divisional magnetics are of different diameters.

14. The magnetic field generating apparatus of claim 1, wherein:

the first plurality of first divisional magnets, the second plurality of first divisional magnets, first plurality of second divisional magnets, and the second plurality of second divisional magnets are each selectable to adjustably generate a magnetic field comprised of the main magnetic field and the secondary magnetic field, and the one or more yokes of first main magnetic pole yoke portion average the magnetic fields generated by the first plurality of first divisional magnets, the one or more yokes of the second main magnetic pole yoke portion average the magnetic fields generated by the second plurality of first divisional magnets, the one or more yokes of the first secondary magnetic pole yoke portion average the magnetic fields generated by the first plurality of second divisional magnets, and the second secondary magnetic pole yoke portion average the magnetic fields generated by the second plurality of second divisional magnets.

15. The magnetic field generating apparatus of 1, wherein each of first main magnetic pole yoke portion, the second main magnetic pole yoke portion, the first secondary magnetic pole yoke portion, and the second secondary magnetic pole yoke portion respectively comprises one yoke.

* * * * *